(12) United States Patent
Ma et al.

(10) Patent No.: US 12,740,272 B2
(45) Date of Patent: Sep. 15, 2026

(54) DISPLAY PANEL

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Danyang Ma, Beijing (CN); Cheng Xu, Beijing (CN); Hongli Wang, Beijing (CN); Pan Li, Beijing (CN); Xinxin Wang, Beijing (CN); Xinyin Wu, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 267 days.

(21) Appl. No.: 18/693,351

(22) PCT Filed: Jun. 30, 2023

(86) PCT No.: PCT/CN2023/104907

§ 371 (c)(1),
(2) Date: Mar. 19, 2024

(87) PCT Pub. No.: WO2024/239428

PCT Pub. Date: Nov. 28, 2024

(65) Prior Publication Data

US 2025/0248242 A1 Jul. 31, 2025

(30) Foreign Application Priority Data

May 19, 2023 (CN) ......................... 202310572985.4

(51) Int. Cl.
*H10K 59/131* (2023.01)
*H10K 59/122* (2023.01)
*H10K 59/35* (2023.01)

(52) U.S. Cl.
CPC ......... *H10K 59/131* (2023.02); *H10K 59/122* (2023.02); *H10K 59/353* (2023.02)

(58) Field of Classification Search
CPC ... H10K 59/131; H10K 59/353; H10K 59/122
(Continued)

(56) References Cited

U.S. PATENT DOCUMENTS 6,596,639 B1 * 7/2003 Easter .................. H10P 95/062
438/626
9,927,668 B2 * 3/2018 Ding ................ G02F 1/133512
(Continued)

FOREIGN PATENT DOCUMENTS

EP 2876684 A2 5/2015

OTHER PUBLICATIONS

EESR from Application No. 23938097.5; Mailing Date: May 27, 2026.

*Primary Examiner* — Pritham D Prabhakher
(74) *Attorney, Agent, or Firm* — Dilworth & Barrese, LLP.; Michael J. Musella, Esq.

(57) ABSTRACT

A display panel is provided. The display panel includes a base substrate and a plurality of sub-pixels, each of at least part of the sub-pixels includes a pixel driving circuit and a light-emitting device, the pixel driving circuit includes a first metal pattern, an active pattern and a second metal pattern, and the light-emitting device includes an electrode pattern electrically connected to the second metal pattern, the at least part of the sub-pixels includes a first color sub-pixel and a second color sub-pixel, in the first color sub-pixel, a ratio of an overlapping area of the active pattern and the first metal pattern to an area of the electrode pattern is X1, in the second color sub-pixel, a ratio of an overlapping area of the active pattern and the first metal pattern to an area of the electrode pattern is X2, and $\frac{1}{2} \leq X_1/X_2 < 1$.

20 Claims, 10 Drawing Sheets

(58) Field of Classification Search
USPC .............................................................. 257/89
See application file for complete search history.

(56) References Cited

U.S. PATENT DOCUMENTS

| | | | | |
|---|---|---|---|---|
| 11,231,629 | B2 * | 1/2022 | Wang | H10D 86/451 |
| 11,790,847 | B2 * | 10/2023 | Du | H10K 59/80521<br>345/690 |
| 12,069,924 | B2 * | 8/2024 | Wang | G09G 3/3266 |
| 12,101,973 | B2 * | 9/2024 | Liu | G09G 3/3241 |
| 12,217,534 | B2 * | 2/2025 | Xu | G06F 3/0412 |
| 12,245,469 | B2 * | 3/2025 | Kim | H10K 59/124 |
| 2014/0159086 | A1 * | 6/2014 | Yu | G02F 1/136209<br>257/98 |
| 2018/0233703 | A1 * | 8/2018 | Lee | H10K 59/878 |
| 2021/0020709 | A1 * | 1/2021 | Yang | H10K 50/865 |
| 2021/0215981 | A1 * | 7/2021 | Wang | G02F 1/13439 |
| 2022/0320247 | A1 * | 10/2022 | Liu | G09G 3/3241 |
| 2023/0030891 | A1 * | 2/2023 | Du | G09G 3/3233 |
| 2023/0200195 | A1 * | 6/2023 | Kim | H10K 59/131<br>257/40 |
| 2023/0207537 | A1 * | 6/2023 | Kwon | H10P 72/78<br>257/89 |

* cited by examiner

DISPLAY PANEL

CROSS-REFERENCE TO RELATED APPLICATIONS

The application claims priority to the Chinese patent application No. 202310572985.4, filed on May 19, 2023, the entire disclosure of which is incorporated herein by reference as part of the present application.

TECHNICAL FIELD

Embodiments of the present disclosure relate to a display panel.

BACKGROUND

OLED (Organic Light-emitting Diode) display devices have a series of advantages, such as self-luminescence, high contrast, high definition, wide viewing angle, low power consumption, fast response and low manufacturing cost, etc., have become one of the key development directions of the new generation of display devices, and have attracted more and more attention. At present, how to optimize the structure of the display device is a subject that technicians in the art are constantly studying.

SUMMARY

At least one embodiment of the present disclosure provides a display panel, the display panel comprises a base substrate and a plurality of sub-pixels on the base substrate, each of at least part of the sub-pixels comprises a pixel driving circuit and a light-emitting device, the pixel driving circuit comprises a first metal pattern, an active pattern and a second metal pattern that are on the base substrate, and the light-emitting device comprises an electrode pattern electrically connected to the second metal pattern, the at least part of the sub-pixels comprises a first color sub-pixel and a second color sub-pixel, the first color sub-pixel and the second color sub-pixel are configured to emit light of different colors, in the first color sub-pixel, a ratio of an overlapping area of the active pattern and the first metal pattern to an area of the electrode pattern is X1, in the second color sub-pixel, a ratio of an overlapping area of the active pattern and the first metal pattern to an area of the electrode pattern is X2, and $\frac{1}{2} \le X_1/X_2 < 1$.

For example, in the display panel provided by at least one embodiment of the present disclosure, the active pattern is on a side of the first metal pattern close to the base substrate or on a side of the first metal pattern away from the base substrate, the second metal pattern is on a side of the active pattern away from the base substrate, and the electrode pattern is on a side of the second metal pattern from the base substrate.

For example, in the display panel provided by at least one embodiment of the present disclosure, a light emission brightness of the first color sub-pixel is L1, a light emission brightness of the second color sub-pixel is L2, and $$-10\% < \frac{\alpha\left(\frac{L1}{L2}\right) - \beta\left(\frac{X1}{X2}\right)}{\frac{1}{(\alpha+\beta)}\left(\left(\frac{L1}{L2}\right) + \left(\frac{X1}{X2}\right)\right)} < 10\%,$$

in which α represents an expected brightness parameter, and a value range of α is $-2.00<\alpha<9.50$, β represents a capacitance compensation parameter, and a value range of β is $0.95<\beta<1.05$.

For example, in the display panel provided by at least one embodiment of the present disclosure, the active pattern is electrically connected to the second metal pattern through a first via, and the second metal pattern is electrically connected to the electrode pattern through a second via; in the first color sub-pixel, a distance between a center point of the first via and a center point of the second via is y1, in the second color sub-pixel, a distance between a center point of the first via and a center point of the second via is y2, and $$a * X_1 + b * \frac{1}{y1} < a * X_2 + b * \frac{1}{y2},$$

in which a and b are constants.

For example, in the display panel provided by at least one embodiment of the present disclosure, $$-7\% < \frac{\alpha\left(\frac{L1}{L2}\right) - \gamma\left(\frac{y2}{y1}\right)}{\frac{1}{(\alpha+\gamma)}\left(\left(\frac{L1}{L2}\right) + \left(\frac{y2}{y1}\right)\right)} < 7\%,$$

in which γ represents a compensation parameter of light intensity control, and a value range of γ is $\gamma<-0.4$ or $\gamma>0.3$.

For example, in the display panel provided by at least one embodiment of the present disclosure, $$-5\% < \frac{\alpha\left(\frac{L1}{L2}\right) - \beta\left(\frac{X1}{X2}\right) - \gamma\left(\frac{y2}{y1}\right)}{\frac{1}{(\alpha+\beta+\gamma)}\left(\left(\frac{L1}{L2}\right) + \left(\frac{X1}{X2}\right) + \left(\frac{y2}{y1}\right)\right)} < 5\%.$$

For example, the display panel provided by at least one embodiment of the present disclosure further comprises: a planarization layer, on a side of the second metal pattern away from the base substrate, in which the second via penetrates the planarization layer, the second via has a first opening on a surface of the planarization layer away from the base substrate, and has a second opening on a surface of the planarization layer close to the base substrate, and an orthographic projection of the second opening on the base substrate is within an orthographic projection of the first opening on the base substrate, in the first color sub-pixel, an overlapping area of the orthographic projection of the first opening on the base substrate and an orthographic projection of the second metal pattern on the base substrate is Y1, in the second color sub-pixel, an overlapping area of the orthographic projection of the first opening on the base substrate and an orthographic projection of the second metal pattern on the base substrate is Y2, and Y1>Y2.

For example, in the display panel provided by at least one embodiment of the present disclosure, a value range of a slope angle α1 of the planarization layer at a position of the second via is: 75 degrees≥α1≥40 degrees.

For example, in the display panel provided by at least one embodiment of the present disclosure, in a direction perpendicular to the base substrate, a value range of a thickness h of the planarization layer is: h≤5.5 microns.

For example, the display panel provided by at least one embodiment of the present disclosure further comprises: a pixel definition layer, on a side of the electrode pattern away from the base substrate, in which the pixel definition layer comprises a plurality of first barrier dams extending in a first direction and a plurality of second barrier dams extending in a second direction, and the first barrier dams and the second barrier dams are configured to define sub-pixel openings of the plurality of sub-pixels, and the first direction is different from the second direction; the light-emitting device further comprises a light-emitting material layer in each of the plurality of sub-pixel openings, in a direction perpendicular to the base substrate, a thickness of the first barrier dam is greater than a thickness of the second barrier dam, at a position of the second via, along the second direction, a thickness of the planarization layer is $h1$ at a boundary of the second metal pattern, a thickness of the planarization layer is $h2$ at a boundary of the light-emitting material layer, and a thickness of the planarization layer at a boundary of the electrode pattern is $h3$, and $h1/h2<h2/h3$.

For example, in the display panel provided by at least one embodiment of the present disclosure, a diameter of the first opening is $L\mathbf{1}$, a diameter of the second opening is $L\mathbf{2}$, and $L\mathbf{1}>L\mathbf{2}+2*f*(h/\tan\alpha\mathbf{1})$, f is a constant, and $1.5\leq f\leq 3.4$.

For example, in the display panel provided by at least one embodiment of the present disclosure, $L\mathbf{1}/L\mathbf{2}\geq 2.5$.

For example, in the display panel provided by at least one embodiment of the present disclosure, $h=k*h2$, k is a constant, and $0.5<k<1$.

For example, in the display panel provided by at least one embodiment of the present disclosure, in the direction perpendicular to the base substrate, the second barrier dam comprises a first part overlapping with the second via and a second part not overlapping with the second via, and a thickness of the first part is greater than a thickness of the second part.

For example, in the display panel provided by at least one embodiment of the present disclosure, a slope angle of the first part at a boundary of the second via is smaller than a slope angle $\alpha\mathbf{1}$ of the planarization layer at a position of the second via.

For example, in the display panel provided by at least one embodiment of the present disclosure, in the first direction, in at least part of the sub-pixels, shortest distances between the center point of the second via and edges of the second barrier dam covering the second via are different.

For example, in the display panel provided by at least one embodiment of the present disclosure, in the second direction, in at least part of the sub-pixels, distances between the center point of the second via and two adjacent first barrier dams are different.

For example, in the display panel provided by at least one embodiment of the present disclosure, the first color sub-pixel is a blue sub-pixel, and the second color sub-pixel is a green sub-pixel or a red sub-pixel.

For example, in the display panel provided by at least one embodiment of the present disclosure, the at least part of the sub-pixels further comprises a third color sub-pixel, and the display panel further comprises a plurality of reset signal lines configured to transmit reset signals to the at least part of the sub-pixels, an extension length of a reset signal line transmitting a reset signal for the first color sub-pixel in a second direction is $D\mathbf{1}$, an extension length of a reset signal line transmitting a reset signal for the second color sub-pixel in the second direction is $D\mathbf{2}$, and an extension length of a reset signal line transmitting a reset signal for the third color sub-pixel in the second direction is $D\mathbf{3}$, and $D\mathbf{3}>D\mathbf{2}$, $D\mathbf{3}>D\mathbf{1}$.

For example, in the display panel provided by at least one embodiment of the present disclosure, the first color sub-pixel is a blue sub-pixel, the second color sub-pixel is a green sub-pixel, and the third color sub-pixel is a red sub-pixel.

For example, in the display panel provided by at least one embodiment of the present disclosure, at least part of the plurality of reset signal lines respectively comprise a part extending in a first direction and a part extending in the second direction, the first direction is different from the second direction.

For example, in the display panel provided by at least one embodiment of the present disclosure, signal lines extending along the first direction are respectively provided at two sides, in the second direction, of the electrode pattern, in at least part of the sub-pixels, signals transmitted by the signal lines extending along the first direction at the two sides of the electrode pattern are different.

BRIEF DESCRIPTION OF DRAWINGS

In order to clearly illustrate technical solutions of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objectives, technical details, and advantages of the embodiments of the present disclosure clearer, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

In some embodiments, in the display region of the OLED display panel, a 3T1C pixel driving circuit may be used to drive the light-emitting device to emit light. For example, FIG. 1A shows a circuit diagram of a 3T1C pixel driving circuit, and FIG. 1B is a timing diagram of the pixel driving circuit in FIG. 1A.

Figure 1A:
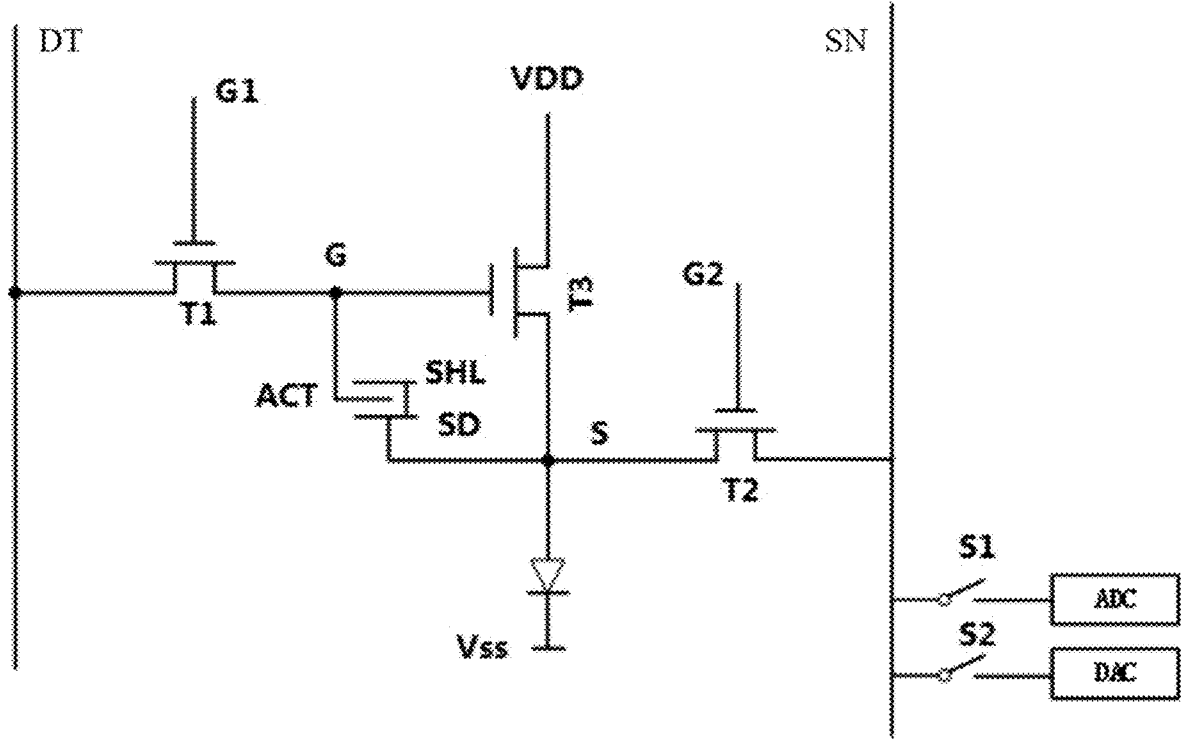
FIG. 1A is a circuit diagram of a 3T1C pixel driving circuit of a display panel.
Figure 1B:
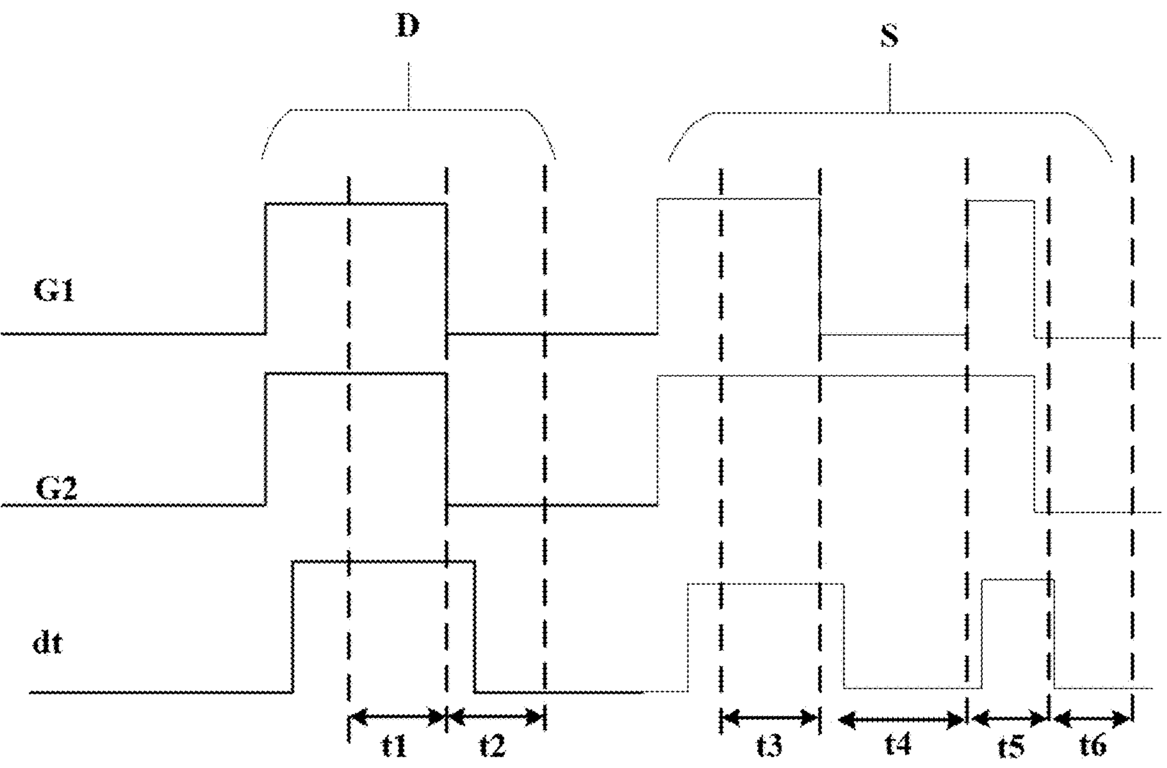
FIG. 1B is a timing diagram of the circuit diagram in FIG. 1A.

For example, as shown in FIG. 1A and FIG. 1B, the pixel driving circuit includes structures such as a first transistor T1, a second transistor T2, a third transistor T3, and a storage capacitor, and so on, the storage capacitor includes a first capacitor and a second capacitor that are electrically connected in parallel, the first capacitor is constituted by a first capacitor electrode ACT and a second capacitor electrode SHL, and the second capacitor is constituted by the first capacitor electrode ACT and a third capacitor electrode SD, the pixel driving circuit is connected with signal lines such as a data line DT, a sensing line SN, a high-level power supply line VDD and a low-level power supply line VSS, and elements such as an analog-to-digital converter ADC and a digital-to-analog converter DAC which are respectively connected to the sensing line SN through a switch S1 and a switch S2, and has the connection relationship as shown in FIG. 1A.

In the working process of the above-mentioned 3T1C pixel driving circuit, combining with FIG. 1A and FIG. 1B, in the light-emitting stage D, in the period t1, the first control signal G1 and the second control signal G2 are turn-on signals and are respectively input to the gate electrode of the first transistor T1 and the gate electrode of the second transistor T2, thus the first transistor T1 and the second transistor T2 are turned on, and the data signal dt is transmitted to the gate electrode of the third transistor T3 through the first transistor T1, thus the third transistor T3 is turned on, and the sensing IC writes the reset signal Vint to the first electrode (e.g., anode) of the light-emitting device through the sensing line SN and the second transistor T2.

In the period t2, the first control signal G1 and the second control signal G2 are turn-off signals, the voltages on two terminals of the storage capacitor remain unchanged, and the third transistor T3 works in a saturated state and the current remains unchanged, and the third transistor T3 drives the light-emitting device to emit light.

At this time, if the pixel row where the light-emitting device is located needs compensation, it will enter the sensing stage S, that is, the periods t3-t6.

In the period t3, the first control signal G1 and the second control signal G2 are turn-on signals, which are respectively input to the gate electrode of the first transistor T1 and the gate electrode of the second transistor T2, thus the first transistor T1 and the second transistor T2 are turned on, the data signal dt is transmitted to the gate electrode of the third transistor T3 through the first transistor T1, thus the third transistor T3 is turned on, and the sensing IC writes the reset signal Vint to the first electrode (e.g. anode) of the light-emitting device through the sensing line SN and the second transistor T2.

In the period t4, the first transistor T1 is turned off, the second transistor T2 and the third transistor T3 are turned on, and the parasitic capacitance of the sensing line SN is discharged through the point S until Vgs of the third transistor T3 is equal to Vth, so that the third transistor T3 is turned off. At this time, the sensing IC can obtain the potential of the point S to calculate the Vth of the third transistor, and the characteristic parameters such as the mobility of the third transistor can also be calculated according to the discharge curve of the point S in the sensing stage.

In the period t5, the first transistor T1 is turned on, and the data line DT writes the data voltage to the gate electrode of the third transistor T3, because the pixel row where the light-emitting device is located does not emit light during the sensing stage, a dark line will appear during the display, therefore, after the t4 stage is over, a data voltage is written immediately to enable the pixels in this pixel row to emit light, which reduces the influence of the dark line on the display effect.

In the period t6, the first transistor T1 and the second transistor T2 are turned off, and the light-emitting device emits light.

The above-mentioned periods t5 and t6 are the added time sequences for startup compensation, and these two stages are not needed in shutdown compensation.

The above-mentioned pixel driving circuit can be realized by various circuit layouts, and different layouts can affect the display effect of the display device.

At least one embodiment of the present disclosure provides a display panel, and the display panel includes a base substrate and a plurality of sub-pixels arranged on the base substrate, in which each of at least part of the sub-pixels includes a pixel driving circuit and a light-emitting device, the pixel driving circuit includes a first metal pattern, an active pattern and a second metal pattern that are arranged on the base substrate, and the light-emitting device includes an electrode pattern electrically connected with the second metal pattern, the at least part of the sub-pixels includes a first color sub-pixel and a second color sub-pixel, the first color sub-pixel and the second color sub-pixel are configured to emit light of different colors, in the first color sub-pixel, the ratio of an overlapping area of the active pattern and the first metal pattern to an area of the electrode pattern is X1, in the second color sub-pixel, the ratio of an overlapping area of the active pattern and the first metal pattern to an area of the electrode pattern is X2, and $\frac{1}{2} \le X1/X2 < 1$.

The display panel provided by the embodiments of the present disclosure can balance the signal transmission speed and magnitude of the signal transmitted to the light-emitting device by the pixel driving circuit in each sub-pixel by designing the ratio of the overlapping area of the active pattern and the first metal pattern to the area of the electrode pattern in sub-pixels of different colors, so as to balance the light-emitting duration of each sub-pixel and improve the display effect of the display panel.

The display panel provided by the embodiments of the present disclosure are described below through several specific embodiments.

Figure 2:
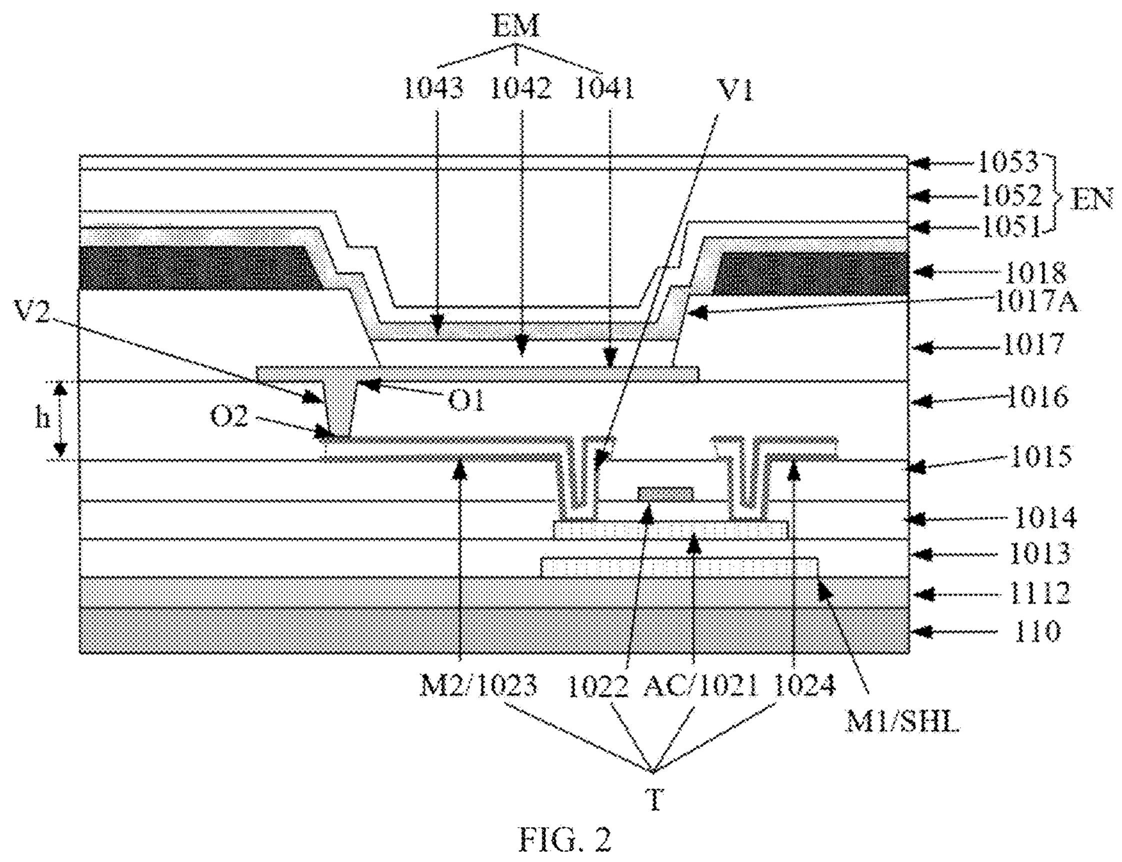
FIG. 2 is a partial cross-sectional schematic view of a sub-pixel in a display panel provided by at least one embodiment of the present disclosure.

At least one embodiment of the present disclosure provides a display panel, and FIG. 2 shows a partial cross-sectional schematic view of a sub-pixel in the display panel. As shown in FIG. 2, the display panel includes a base substrate 110 and a plurality of sub-pixels arranged on the base substrate 110, and each of at least part of the sub-pixels includes a pixel driving circuit and a light-emitting device EM. The pixel driving circuit includes a first metal pattern M1, an active pattern AC and a second metal pattern M2 that are arranged on the base substrate 110, and the light-emitting device EM includes an electrode pattern 1041 electrically connected to the second metal pattern M2.

The at least part of the sub-pixels includes a first color sub-pixel and a second color sub-pixel, and the first color sub-pixel and the second color sub-pixel are configured to emit light of different colors. For example, in the first color sub-pixel, the ratio of the overlapping area of the active pattern AC and the first metal pattern M1 to the area of the electrode pattern 1041 is X1, and in the second color sub-pixel, the ratio of the overlapping area of the active pattern AC and the first metal pattern M1 to the area of the electrode pattern 1041 is X2, and it is satisfied that $$1/2 \leq X1/X2 < 1.$$

For example, the larger the overlapping area of the active pattern AC and the first metal pattern M1, the greater the amount of electricity that can be stored in the storage capacitor formed by the active pattern AC and the first metal pattern M1, so that the better the signal holding function, the longer the light-emitting duration of the light-emitting device EM. In different sub-pixels, because of the size differences of electrode patterns 1041, the differences of signal transmission paths and the differences of light-emitting properties of light-emitting material layers of light-emitting devices EM, the light-emitting properties of different sub-pixels are different. By designing the ratio of the overlapping area of the active pattern AC and the first metal pattern M1 to the area of the electrode pattern 1041, the signal transmission speed and magnitude of the signal transmitted to the light-emitting device EM by the pixel driving circuit in each sub-pixel can be balanced, so as to balance the light-emitting duration of each sub-pixel and improve the display effect of the display panel.

For example, in some embodiments, the above at least part of the sub-pixels may include a blue sub-pixel, a green sub-pixel and a red sub-pixel. For example, the first color sub-pixel may be a blue sub-pixel and the second color sub-pixel may be a green sub-pixel or a red sub-pixel.

For example, in some embodiments, the pixel driving circuit includes a plurality of thin film transistors, and FIG. 2 shows a schematic cross-sectional view of the thin film transistor T electrically connected with the light-emitting device EM. For example, in the case that the pixel driving circuit is the above-mentioned 3T1C pixel driving circuit, the thin film transistor shown in FIG. 2 is the third transistor in FIG. 1A. As shown in FIG. 2, the thin film transistor T includes an active layer 1021, a gate electrode 1022, and source and drain electrodes 1023 and 1024.

For example, in some embodiments, as shown in FIG. 2, the active pattern AC is arranged on the side of the first metal pattern M1 away from the base substrate 110. In this case, the first metal pattern M1 may be a light-shielding pattern SHL, and the light-shielding pattern SHL can shield light for the active pattern AC, for example, the active pattern AC is arranged in the same layer as the active layer 1021 of the thin film transistor, or, the active pattern AC also serves as the active layer 1021.

Figure 3:
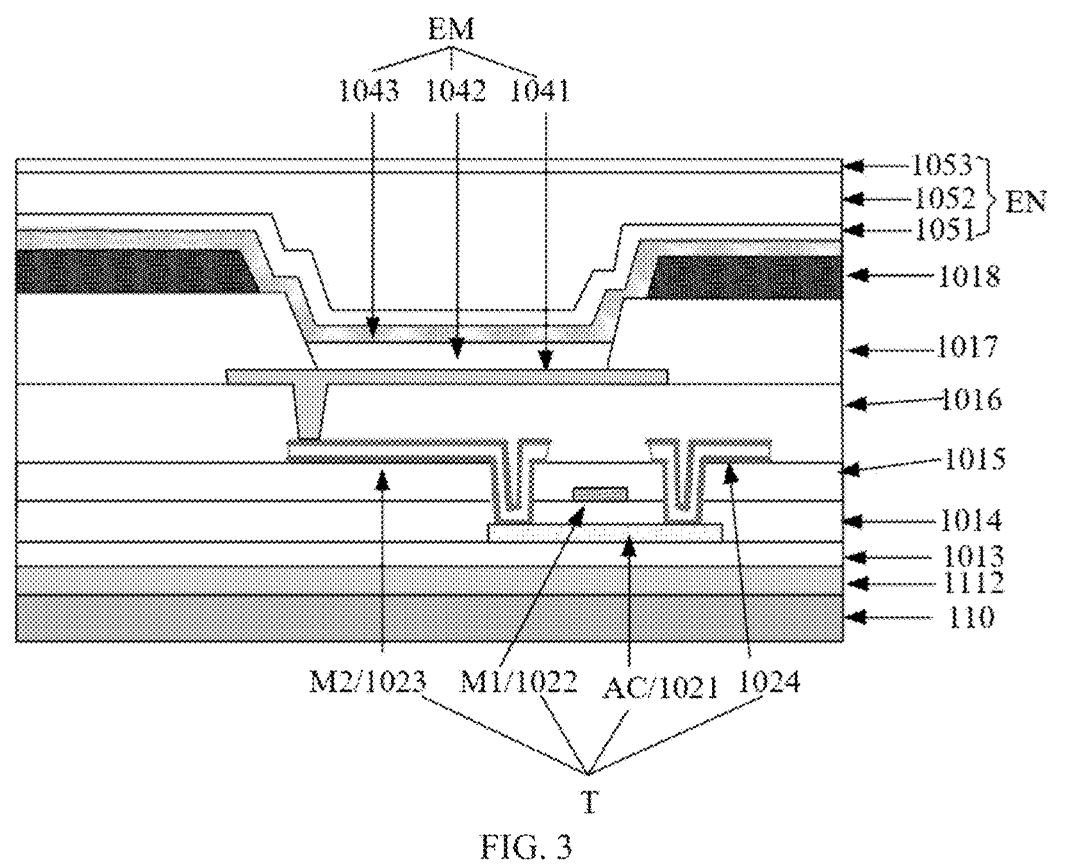
FIG. 3 is a partial cross-sectional schematic view of a sub-pixel in another display panel provided by at least one embodiment of the present disclosure.

Alternatively, in some other embodiments, as shown in FIG. 3, the active pattern AC is arranged on the side of the first metal pattern M1 close to the base substrate 110. In this case, the first metal pattern M1 can be in the gate metal layer, that is, arranged in the same layer as the gate electrode 1022 of the thin film transistor T, or the first metal pattern M1 also serves as the gate electrode 1022, and the active pattern AC is arranged in the same layer as the active layer 1021 of the thin film transistor T, or the active pattern AC also serves as the active layer 1021.

For example, as shown in FIG. 2 and FIG. 3, the second metal pattern M2 is arranged on the side of the active pattern AC away from the base substrate 110, for example, the second metal pattern M2 is arranged in the same layer as the source and drain electrodes 1023 of the thin film transistor T or also serves as the source and drain electrodes 1023 of the thin film transistor T. The electrode pattern 1041 is arranged on the side of the second metal pattern M2 away from the base substrate 110, and the electrode pattern 1041 can be used as the anode of the light-emitting device EM.

It should be noted that, in the embodiments of the present disclosure, the term "in the same layer" means that two (or more) function layers or structure layers are in the same layer in the hierarchical structure of the display substrate and formed of the same material, that is, in the preparation process of the display panel, the two function layers or structure layers can be formed of the same material layer, and the required patterns and structures can be formed by the same one patterning process.

For example, in the direction perpendicular to the base substrate 110, the active pattern AC at least partially overlaps with the light-shielding pattern SHL, so that the active pattern AC and the light-shielding pattern SHL can form a first capacitor of a storage capacitor. For example, the active pattern AC at least partially overlaps with the second metal pattern M2, so that the active pattern AC and the second metal pattern M2 can form a second capacitor of a storage capacitor, and the first capacitor and the second capacitor are connected in parallel.

For example, in some embodiments, under the same driving conditions, for example, under the same driving current, the light emission brightness of the first color sub-pixel is L1, the light emission brightness of the second color sub-pixel is L2, and it is satisfied that $$-10\% < \frac{\alpha\left(\frac{L1}{L2}\right) - \beta\left(\frac{X1}{X2}\right)}{\frac{1}{(\alpha+\beta)}\left(\left(\frac{L1}{L2}\right) + \left(\frac{X1}{X2}\right)\right)} < 10\%.$$

In the above formula, α represents the expected brightness parameter, and the value range of α is $-2.00<\alpha<9.50$. For example, α may be equal to about −1.00, 3.00, 4.00, 5.00, 6.00 or 8.00, and β represents the capacitance compensation parameter, and the value range of β is $0.95<\beta<1.05$, for example, β may be equal to about 1.00, etc.

For example, in the above embodiment, the first color sub-pixel may be a blue sub-pixel, and the second color sub-pixel may be a green sub-pixel or a red sub-pixel. Because the light emission brightness of the blue sub-pixel is lower than the light emission brightness of the green sub-pixel or the red sub-pixel, through the above design, the light emission brightness differences of sub-pixels of different colors can be balanced, so that the light emission brightness differences of sub-pixels of different colors are within an acceptable range, so as to improve the display effect of the display substrate.

For example, corresponding to the embodiment shown in FIG. 2, FIGS. 4A-4G show schematic planar views of various function layers in the display panel, and FIGS. 5A-5D show schematic planar views of a plurality of function layers that are stacked in the display panel.

It should be noted that in the embodiment shown in FIGS. 4A-4G and FIGS. 5A-5D, one red sub-pixel R, one green sub-pixel G and one blue sub-pixel B constitute one pixel unit, and in the row direction, that is, in the horizontal direction in the FIG., the red sub-pixel R, the green sub-pixel G and the blue sub-pixel B are sequentially arranged to form a plurality of pixel units arranged periodically. For example, FIGS. 4A-4G and FIGS. 5A-5D respectively show two pixel units located in the same row as an example, and the display panel adopts the 3T1C pixel driving circuit as shown in FIG. 1A.

Figures 4A, 4B:
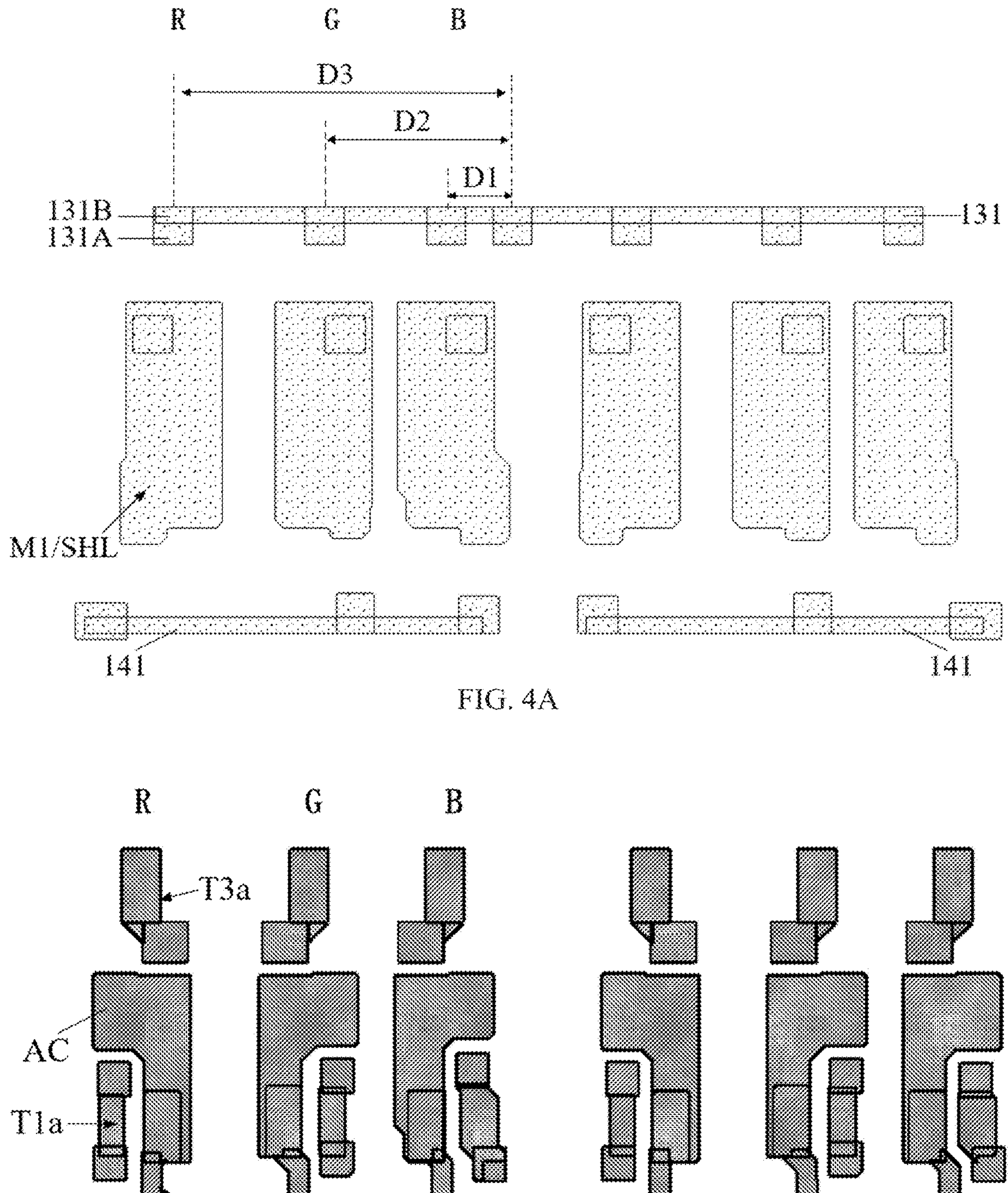
FIGS. 4A-4G are schematic planar views of various function layers in the display panel provided by at least one embodiment of the present disclosure.

For example, FIG. 4A shows a schematic planar view of a first conductive layer where the light-shielding pattern SHL of the display panel is located.

As shown in FIG. 4A, the first conductive layer includes a reset signal line 131, a power line segment 141 and a light-shielding pattern SHL (serving as the first metal pattern M1) that are insulated from each other. For example, the light-shielding pattern SHL can achieve a light-shielding effect, and can also be used as a capacitor electrode of the storage capacitor of the pixel driving circuit.

For example, in some embodiments, in the same one pixel unit, the light-shielding pattern SHL in the red sub-pixel R and the light-shielding pattern SHL in the green sub-pixel G are arranged substantially symmetrically, and the distance between the light-shielding pattern SHL in the red sub-pixel R and the light-shielding pattern SHL in the green sub-pixel G is greater than the distance between the light-shielding pattern SHL in the green sub-pixel G and the light-shielding pattern SHL in the blue sub-pixel B.

For example, in some embodiments, the display panel includes a plurality of reset signal lines 131 configured to transmit reset signals to at least part of the sub-pixels. For example, the above at least part of the sub-pixels includes a first color sub-pixel (e.g., blue sub-pixel B), a second color sub-pixel (e.g., green sub-pixel G) and a third color sub-pixel (e.g., red sub-pixel R). As shown in FIG. 4A, in at least part of the pixel units, the extension length, in the second direction (horizontal direction in the figure), of the reset signal line transmitting the reset signal for the first color sub-pixel is D1, the extension length, in the second direction, of the reset signal line transmitting the reset signal for the second color sub-pixel is D2, the extension length, in the second direction, of the reset signal line transmitting the reset signal for the third color sub-pixel is D3, and it is satisfied that $$D3 > D2, D3 > D1.$$

For example, in the above embodiment, in the pixel driving circuits, because the lengths of the reset signal lines connected to the reset node S (refer to FIG. 1A) are different, the magnitudes of signals of the same kind provided to sub-pixels of different colors are different. Because of the long lifetime of the red sub-pixel R, the reset signal line of the red sub-pixel R is the longest, and the red sub-pixel R has low reset potential, fast charging and high brightness.

For example, in some embodiments, at least part of the reset signal lines respectively includes a part 131A extending in the first direction and a part 131B extending in the second direction, and the first direction is different from the second direction. For example, the part 131B extending in the second direction is connected to the sensing line SN, and the part 131A extending in the first direction is used to connect the circuits of various sub-pixels. For example, the width of the part 131A extending in the first direction is larger than the width of the part 131B extending in the second direction, so as to facilitate the electrical connection of the part 131A extending in the first direction with circuits located in other layers, for example, through vias, thereby improving the reliability of the electrical connection.

For example, the power line segment 141 is configured to electrically connect with the first power supply line VDD, to be used for transmitting power signals.

Figure 5A:
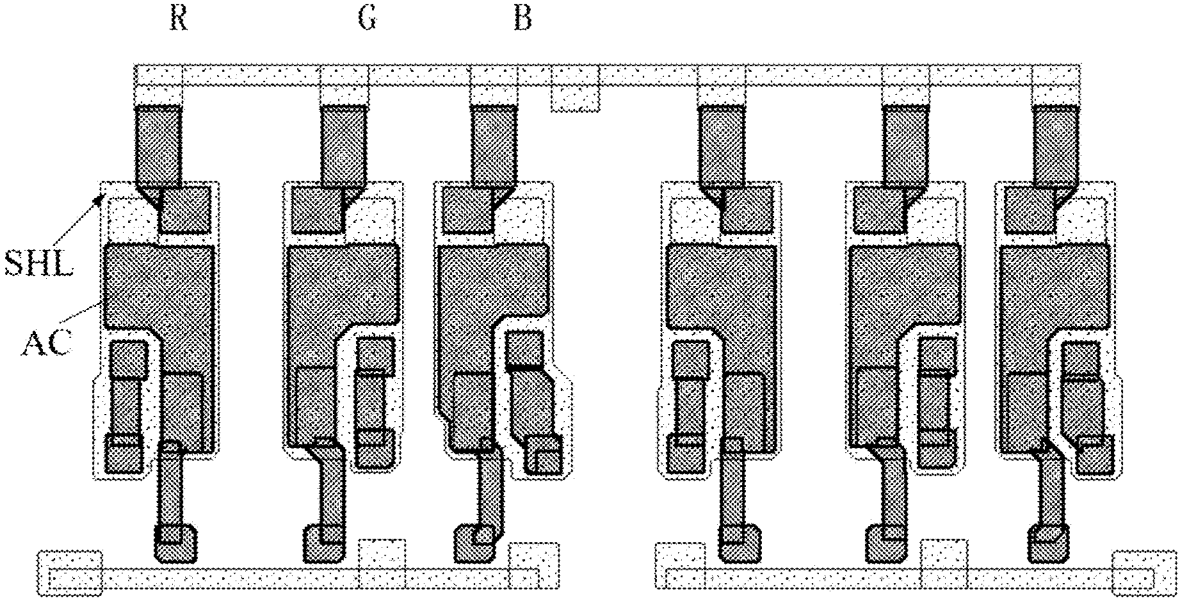
FIGS. 5A-5D are schematic planar views of a plurality of function layers that are stacked in a display panel provided by at least one embodiment of the present disclosure.

For example, FIG. 4B shows a schematic planar view of a semiconductor material layer where the active pattern AC of the display panel is located, and FIG. 5A shows a schematic planar view of the semiconductor material layer and the first conductive layer that are stacked.

As shown in FIG. 4B and FIG. 5A, the semiconductor material layer includes an active pattern T1*a* of the first transistor, an active pattern T2*a* of the second transistor, and an active pattern T3*a* of the third transistor that are spaced apart from each other; the semiconductor material layer further includes an active pattern AC, the active pattern AC is integrally connected with the active pattern T2*a* of the second transistor, or, a part of the active pattern AC serves as the active pattern T2*a* of the second transistor. The active pattern AC at least partially overlaps with the light-shielding pattern SHL, so that the active pattern AC and the light-shielding pattern SHL can form the first capacitor of the storage capacitor.

Figure 4C:
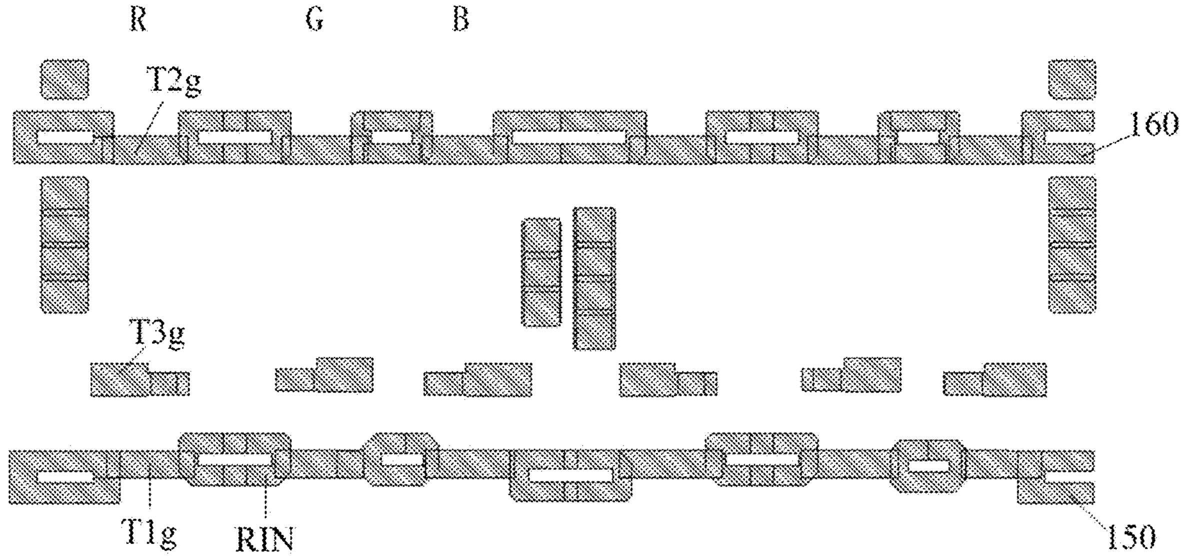
Figure 5B:
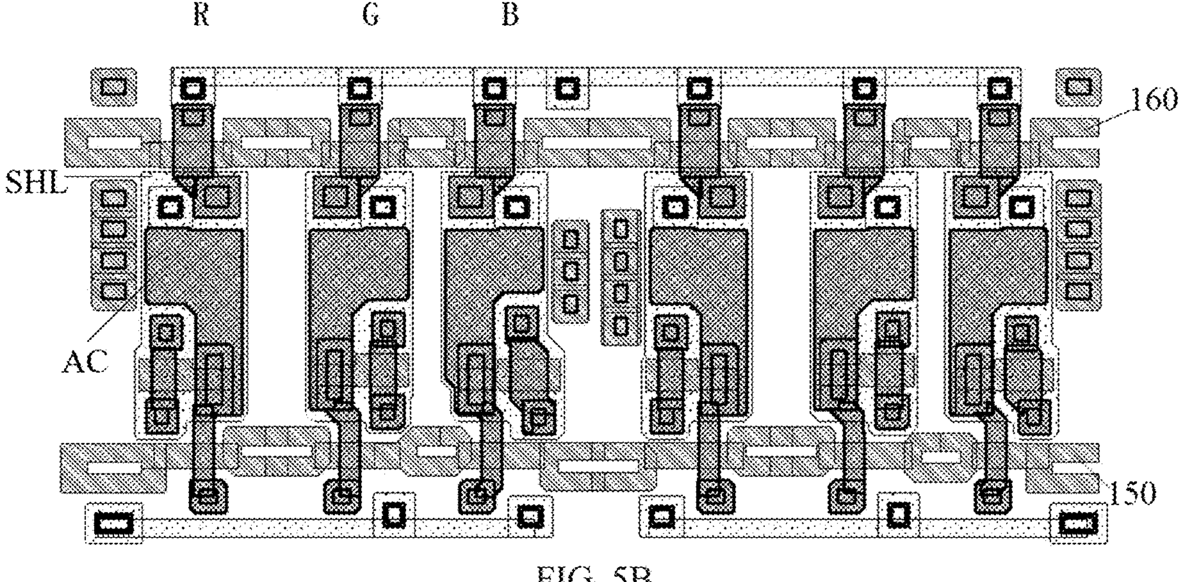
Figure 5B:

For example, FIG. 4C shows a schematic planar view of a second conductive layer where the gate electrode of the display panel is located, and FIG. 5B shows a schematic planar view of the second conductive layer, the semiconductor material layer and the first conductive that are stacked.

As shown in FIG. 4C and FIG. 5B, the second conductive layer includes a first scanning line 150 and a second scanning line 160 that are insulated from each other, and further includes gate electrodes of the transistors that are insulated from each other. For example, the gate electrodes of various transistors are the parts of the first scanning line 150 and the second scanning line 160 that overlap with the active layers, the gate electrodes include, for example, the gate electrode T1*g* of the first transistor, the gate electrode T2*g* of the second transistor and the gate electrode T3*g* of the third transistor.

For example, the parts of the first scanning line 150 and the second scanning line 160 that intersect with the data line, the sensing line SN, and the first power supply line VDD (described later) are in ring-shaped structures RIN, that is, dual-channel structures, which can effectively improve the yield of the devices. For example, the position where the signal lines cross each other is prone to short circuit failure because of electrostatic breakdown of parasitic capacitance, when a short circuit failure occurs in one channel of the ring-shaped structure during the detection process, this channel can be cut off (for example, by laser cutting), and the circuit structure can still work normally through the other channel.

Figure 4D:
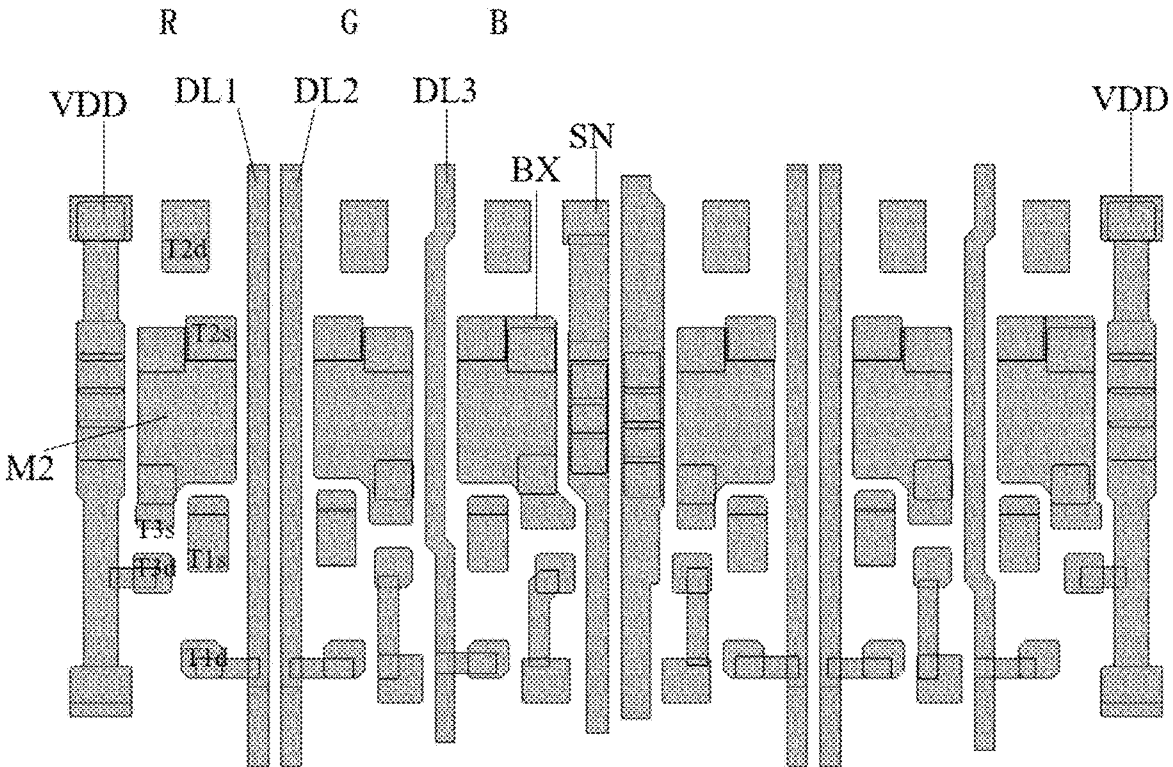
Figure 5C:
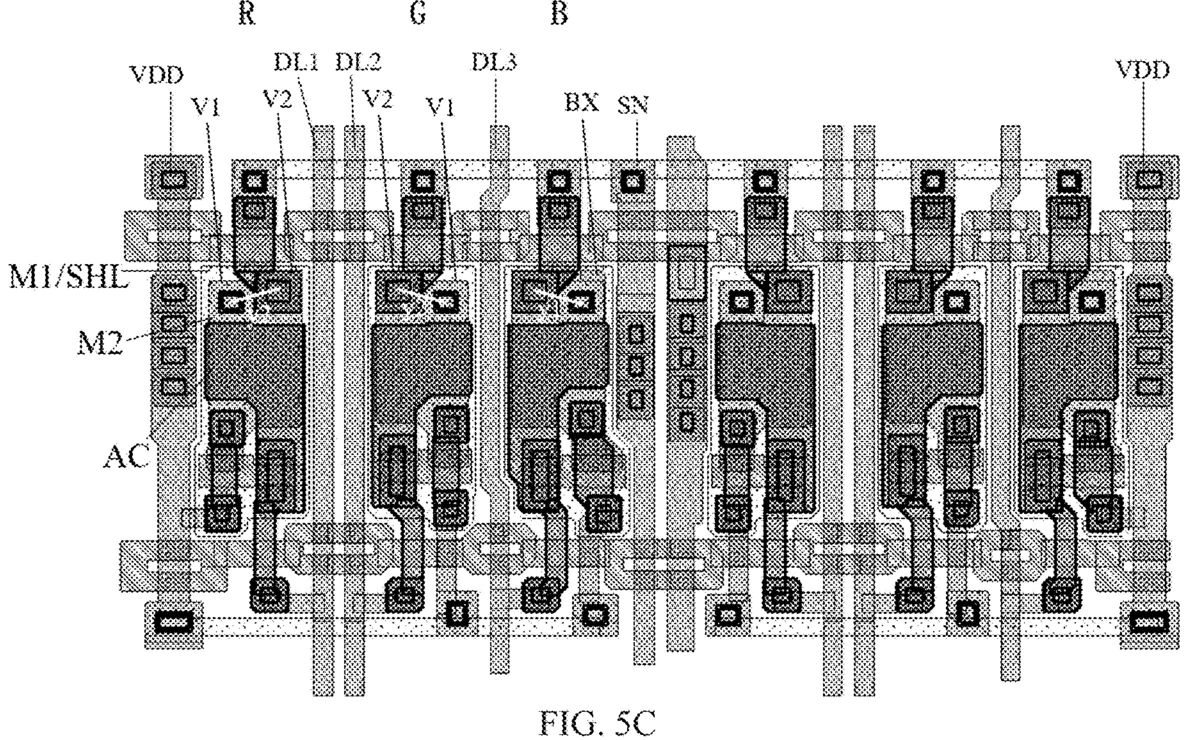

For example, FIG. 4D shows a schematic planar view of a third conductive layer where the source and drain electrodes of the display panel are located, and FIG. 5C shows a schematic planar view of the third conductive layer, the second conductive layer, the semiconductor material layer and the first conductive layer that are stacked.

As shown in FIG. 4D and FIG. 5C, the third conductive layer includes data lines DL1, DL2 and DL3, a sensing line SN, and a first power supply line VDD configured to provide a high-level power signal, etc., and further includes the source and drain electrodes of various transistors, such as the source and drain electrodes T1*d* and T1*s* of the first transistor, the source and drain electrodes T2*d* and T2*s* of the second transistor, and the source and drain electrodes T3*d* and T3*s* of the third transistor. For example, the third conductive layer further includes a second metal pattern M2, the second metal pattern M2 is integrally connected with the source and drain electrodes T2*s* of the second transistor and the source and drain electrodes T3*s* of the third transistor, or, two opposite parts of the second metal pattern M2 are respectively used as the source and drain electrodes T2*s* of the second transistor and the source and drain electrodes T3*s* of the third transistor. For example, the second metal pattern M2 (as the SD in FIG. 1A) and the active pattern AC can form the second capacitor of the storage capacitor, and the second capacitor is connected in parallel with the first capacitor.

For example, as shown in FIG. 2, the display panel further includes a gate insulation layer 1014 arranged on the side of the active pattern AC away from the base substrate 110 and an interlayer insulation layer 1015 arranged on the side of the gate electrode 1022 away from the base substrate 110, as shown in FIG. 2 and FIG. 5C, a first via V1 is provided in the gate insulation layer 1014 and the interlayer insulation layer 1015, and the active pattern AC is electrically connected with the second metal pattern M2 through the first via V1.

Figure 4E:
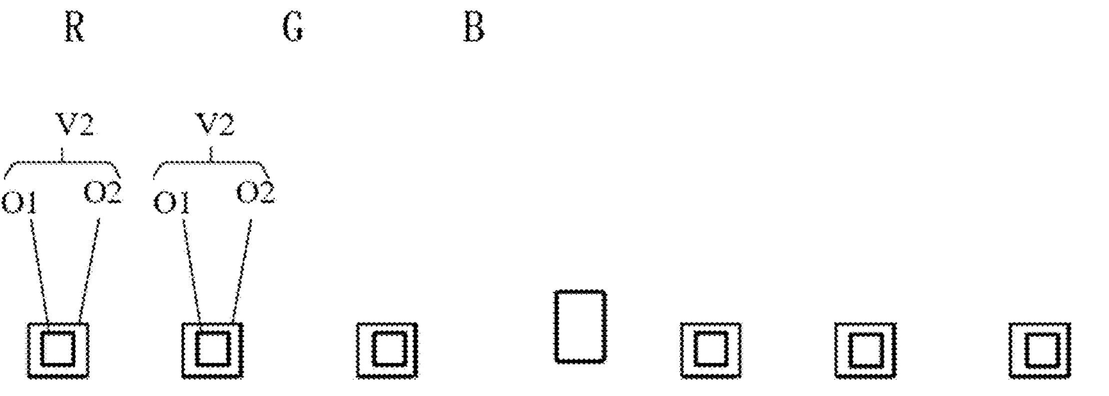

For example, FIG. 4E shows a schematic planar view of a planarization layer of the display panel, and FIG. 5C further shows a schematic planar view of the planarization layer and the third conductive layer, the second conductive layer, the semiconductor material layer and the first conductive layer that are stacked.

As shown in FIG. 2, FIG. 4E and FIG. 5C, the display panel further includes a planarization layer 1016, the planarization layer 1016 is arranged on the side of the second metal pattern M2 (i.e., the above-mentioned third conductive layer) away from the base substrate 110. The planarization layer 1016 includes a second via V2, the second via V2 penetrates the planarization layer 1016, and the second metal pattern M2 (the source and drain electrodes 1023 of the thin film transistor) is electrically connected to the electrode pattern through the second via V2.

For example, the second via V2 has a first opening O1 on the surface of the planarization layer 1016 away from the base substrate 110 (i.e., the upper surface in FIG. 2) and a second opening O2 on the surface of the planarization layer 1016 close to the base substrate 110 (i.e., the lower surface in FIG. 2), and the orthographic projection of the second opening O2 on the base substrate 110 is within the orthographic projection of the first opening O1 on the base substrate 110. For example, the size of the second opening O2 is smaller than the size of the first opening O1.

For example, in the first color sub-pixel (e.g., blue sub-pixel B), the overlapping area of the orthographic projection of the first opening O1 on the base substrate 110 and the orthographic projection of the second metal pattern M2 on the base substrate 110 is Y1, and in the second color sub-pixel (e.g., red sub-pixel R or green sub-pixel G), the overlapping area of the orthographic projection of the first opening O1 on the base substrate 110 and the orthographic projection of the second metal pattern M2 on the base substrate 110 is Y2, and it is satisfied that $$Y1>Y2.$$

For example, at the position of the second via V2, as shown in FIG. 4D, the second metal pattern M2 of the blue sub-pixel B is larger than the second metal pattern M2 of the green sub-pixel G and the second metal pattern M2 of the red sub-pixel R, for example, by a part BX. Because the brightness of blue is weaker than the brightness of red and the brightness of green, the thin film transistor T of the blue sub-pixel B needs to reduce the leakage current better, and therefore in the blue sub-pixel B, the area of the second metal pattern M2 in the thin film transistor T is larger, and the overlapping size of the second metal pattern M2 and the second via V2 which is above the second metal pattern M2 is larger, which can provide a more stable environment and enable the thin film transistor T to work better.

On the other hand, because the position of the thin film transistor T of the blue sub-pixel B is shifted to the right on the display panel as a whole, there may be problems in the contact connection of the second metal pattern M2 and the electrode pattern 1041 at the second via V2, and there may also be problems in the flatness under the second via V2, so it is more beneficial to the contact connection of the second metal pattern M2 and the electrode pattern 1041 by making the second metal pattern M2 larger by a part, and in addition, the part under the second via V2 will be flatter, which is beneficial to ink jet printing of the organic light-emitting material on the electrode pattern 1041 in the preparation process.

For example, as shown in FIG. 5C, in the first color sub-pixel (e.g., blue sub-pixel B), the distance between the center point of the first via V1 and the center point of the second via V2 is y1, and in the second color sub-pixel (e.g., red sub-pixel R or green sub-pixel G), the distance between the center point of the first via V1 and the center point of the second via V2 is y2, and it is satisfied that $$a*X_1+b*\frac{1}{y1}<a*X_2+b*\frac{1}{y2}.$$

In the above formula, a and b are constants. In sub-pixels of different colors, when the signal is transmitted from the active pattern AC to the second metal pattern M2 through the first via V1 and then transmitted to the electrode pattern 1041 through the second via V2, the signal will have different losses due to different signal transmission paths. For example, the theoretical maximum light-emitting duration of each sub-pixel is directly proportional to the ratio of the overlapping area of the active pattern AC and the first metal pattern M1 to the area of the electrode pattern 1041, and inversely proportional to the distance between the center point of the first via V1 and the center point of the second via V2.

For example, in some embodiments, $$-7\% < \frac{\alpha\left(\frac{L1}{L2}\right) - \gamma\left(\frac{y2}{y1}\right)}{\frac{1}{(\alpha+\gamma)}\left(\left(\frac{L1}{L2}\right) + \left(\frac{y2}{y1}\right)\right)} < 7\%.$$

In the above formula, $\gamma$ represents the compensation parameter of light intensity control, and the value range of $\gamma$ is: $\gamma<-0.4$ or $\gamma>0.3$, for example, $\gamma$ is equal to about −0.5 or 0.4, etc. Through the above design, the light-emitting duration and light-emitting brightness of various sub-pixels can be further balanced, and the display effect of the display panel can be improved.

For example, in some embodiments, it is satisfied that $$-5\% < \frac{\alpha\left(\frac{L1}{L2}\right) - \beta\left(\frac{X1}{X2}\right) - \gamma\left(\frac{y2}{y1}\right)}{\frac{1}{(\alpha+\beta+\gamma)}\left(\left(\frac{L1}{L2}\right) + \left(\frac{X1}{X2}\right) + \left(\frac{y2}{y1}\right)\right)} < 5\%.$$

Through the above design, the light-emitting duration and light-emitting brightness of various sub-pixels can be adjusted more accurately, so as to balance the light-emitting duration and light-emitting brightness of each sub-pixel and improve the display effect of the display panel.

Figure 6:
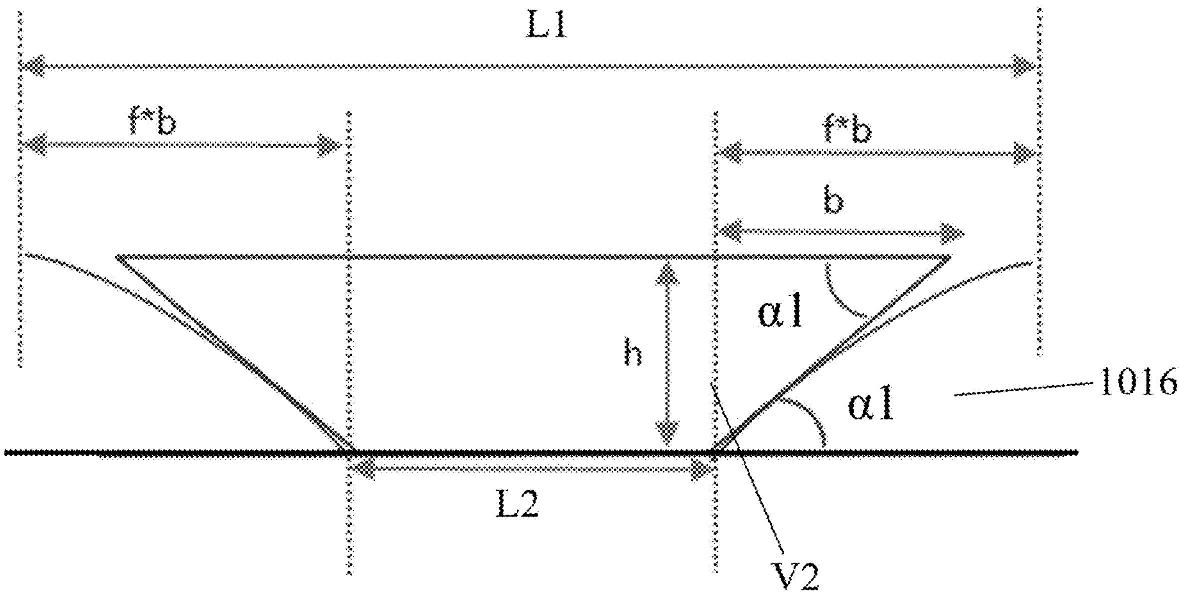
FIG. 6 is a partial cross-sectional schematic view of a planarization layer near a second via of a display panel provided by at least one embodiment of the present disclosure.

For example, FIG. 6 shows a partial cross-sectional schematic diagram of the planarization layer 1016 near the second via V2. As shown in FIG. 6, the planarization layer 1016 has a slope angle $\alpha 1$ at the position of the second via V2, for example, the value range of the slope angle $\alpha 1$ is:

$$75 \text{ degrees} \geq \alpha 1 \geq 40 \text{ degrees}.$$

For example, the slope angle $\alpha 1$ may be equal to 45 degrees, 50 degrees, 55 degrees, 60 degrees, 65 degrees or 70 degrees, etc. In the embodiments of the present disclosure, the smaller the slope angle $\alpha 1$ of the planarization layer 1016 at the second via V2, the greater the aperture ratio of the sub-pixel, but if the slope angle $\alpha 1$ of the planarization layer 1016 at the second via V2 is too large, the risk that the electrode pattern 1041 breaks at the second via V2 is greater. Therefore, the slope angle $\alpha 1$ of the planarization layer 1016 at the second via V2 is designed to be within the above range. Through experiments, the above value range of the slope angle $\alpha 1$ can balance the aperture ratio of the sub-pixel and the risk of breakage of the electrode pattern 1041, that is, in the case that the slope angle $\alpha 1$ of the planarization layer 1016 at the second via V2 is in the above value range, the aperture ratio of the sub-pixel and no breakage of the electrode pattern 1041 at the second via V2 can be simultaneously ensured, thereby ensuring the reliability of the display panel.

For example, in some embodiments, as shown in FIG. 2 and FIG. 6 in the direction perpendicular to the base substrate 110, that is, in the vertical direction in the figure, the value range of the thickness h of the planarization layer 1016 may be:

$$h \leq 5.5 \text{ microns}.$$

For example, 1.0 μm≤h≤5.5 m, for example, h may be equal to 2.0 μm, 3.0 μm, 4.0 μm or 5.0 μm, etc. The thinner the planarization layer 1016, the simpler the etching process for forming the vias (e.g., the second via) in the planarization layer 1016. The thicker the planarization layer 1016, the better the planarization effect. Therefore, in the case that the thickness of the planarization layer 1016 is within the above value range, the above two effects can be balanced.

Figure 4F:
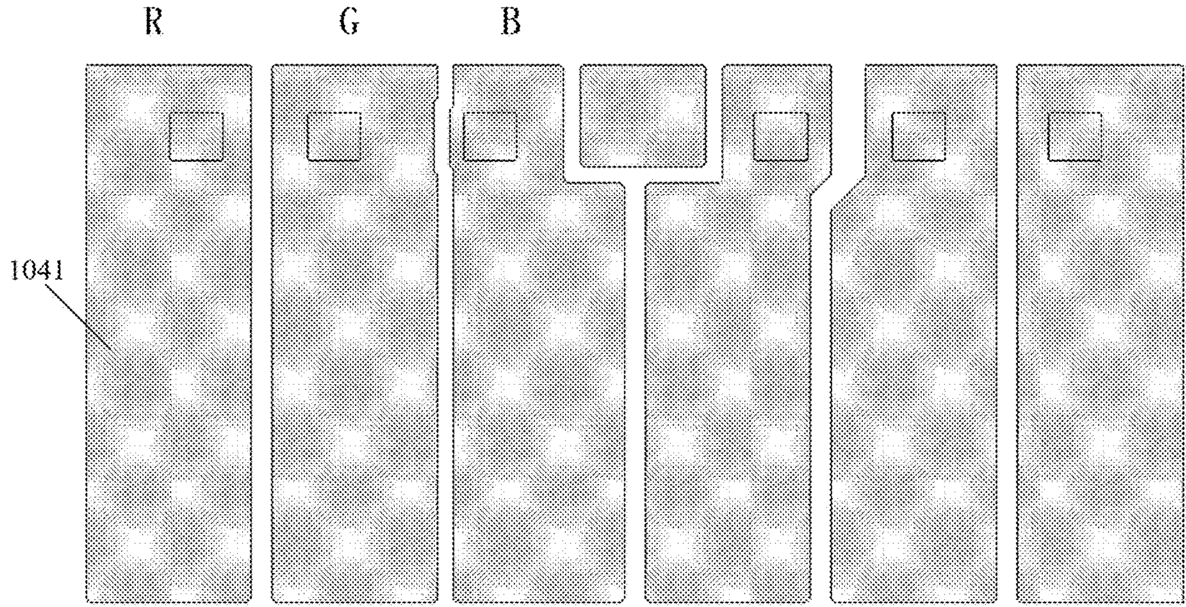
Figure 4G:
Figure 4G:
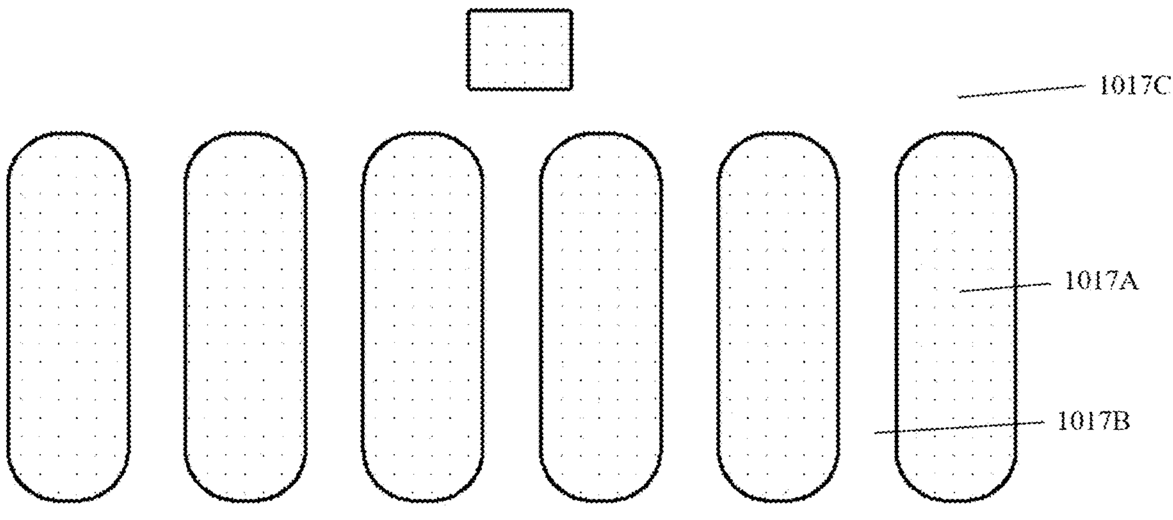
Figure 5D:
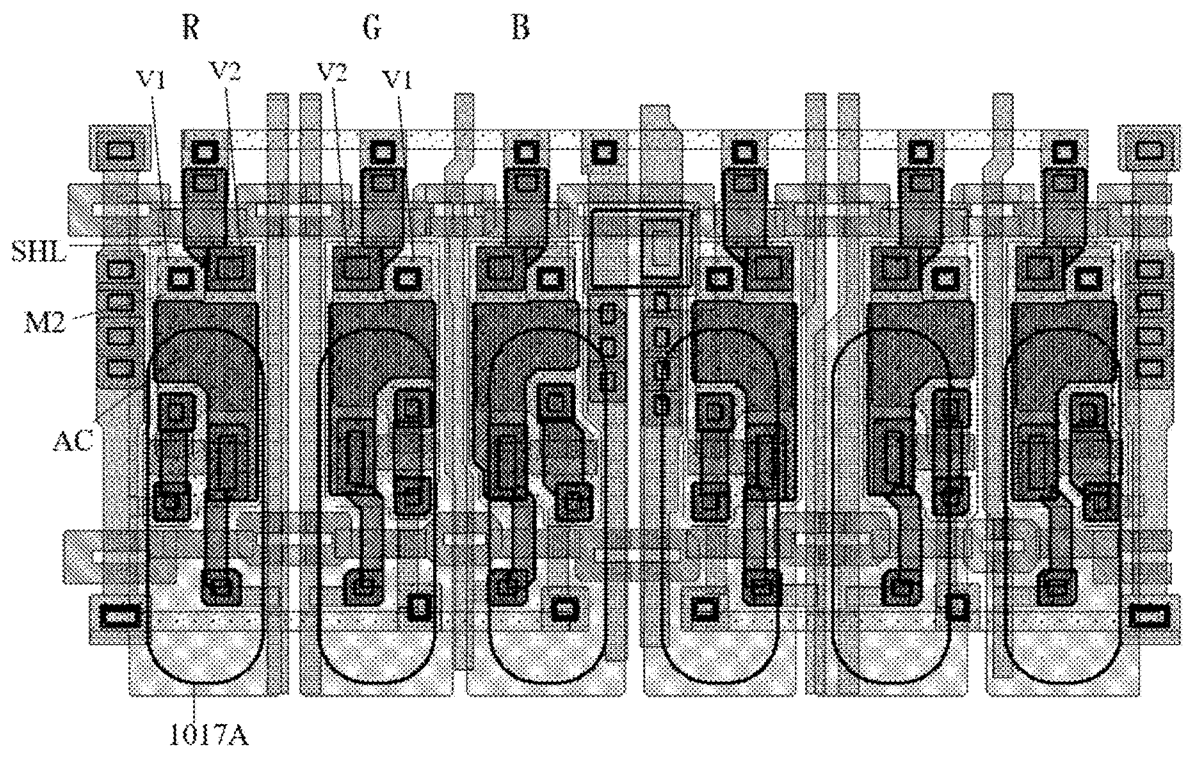

For example, FIG. 4F shows a schematic planar view of a fourth conductive layer where the electrode pattern of the display panel is located, FIG. 4G shows a schematic planar view of a pixel definition layer of the display panel, and FIG. 5D shows a schematic planar view of the pixel definition layer, the fourth conductive pattern, the planarization layer, the third conductive layer, the second conductive layer, the semiconductor material layer and the first conductive layer that are stacked.

As shown in FIG. 4F, the electrode pattern 1041 is in a rectangular shape as a whole, and is electrically connected to the second metal pattern M2 at one side of the rectangle (for example, at the position of the square frame in the figure) through the second via V2.

For example, in some embodiments, as shown in FIG. 4D and FIG. 5D, in the second direction, signal lines extending in the first direction are respectively provided on two sides of the electrode pattern 1041, such as the data lines DL1-DL3, the sensing line SN and the first power supply line VDD. In at least part of the sub-pixels, such as the red sub-pixel R and the blue sub-pixel B, signals transmitted by signal lines extending in the first direction on the two sides of the electrode pattern 1041 are different. For example, in the red sub-pixel R, the signal lines extending in the first direction on the two sides of the electrode pattern 1041 are respectively the data line DL1 and the first power supply line VDD. In the blue sub-pixel B, the signal lines extending in the first direction on the two sides of the electrode pattern 1041 are respectively the data line DL3 and the sensing line SN.

As shown in FIG. 2 and FIG. 4G, the display panel further includes a pixel definition layer 1017, the pixel definition layer 1017 is arranged on the side of the electrode pattern 1041 away from the base substrate 110, and includes a plurality of sub-pixel openings 1017A configured to expose the electrode patterns 1041 of the plurality of sub-pixels.

For example, as shown in FIG. 2, the light-emitting device EM further includes a light-emitting material layer 1042 arranged in the sub-pixel opening 1017A and an electrode layer 1043 at least partially arranged in the sub-pixel opening 1017A, and for example, the electrode layer 1043 serves as the cathode of the light-emitting device EM. The sub-pixel opening 1017A defines the light-emitting region of the sub-pixel, and the part of the light-emitting material layer 1042 located in the sub-pixel opening 1017A is in contact with the electrode pattern 1041, so as to be sandwiched between the electrode pattern 1041 and the electrode layer 1043, so that the light-emitting material layer 1042 can emit light within the region defined by the sub-pixel opening 1017A under the driving of the electrode pattern 1041 and the electrode layer 1043.

For example, the sub-pixel opening 1017A may be in a shape with an arc-shaped edge, such as an oval shape. The shapes and sizes of the sub-pixel openings 1017A corresponding to sub-pixels of different colors may be the same or different. In the embodiment shown in FIG. 4G, the shapes and sizes of the sub-pixel openings 1017A corresponding to sub-pixels of different colors are the same, but in other embodiments, there may be different designs of the shapes and sizes of the sub-pixel openings corresponding to sub-pixels of different colors.

Figure 7:
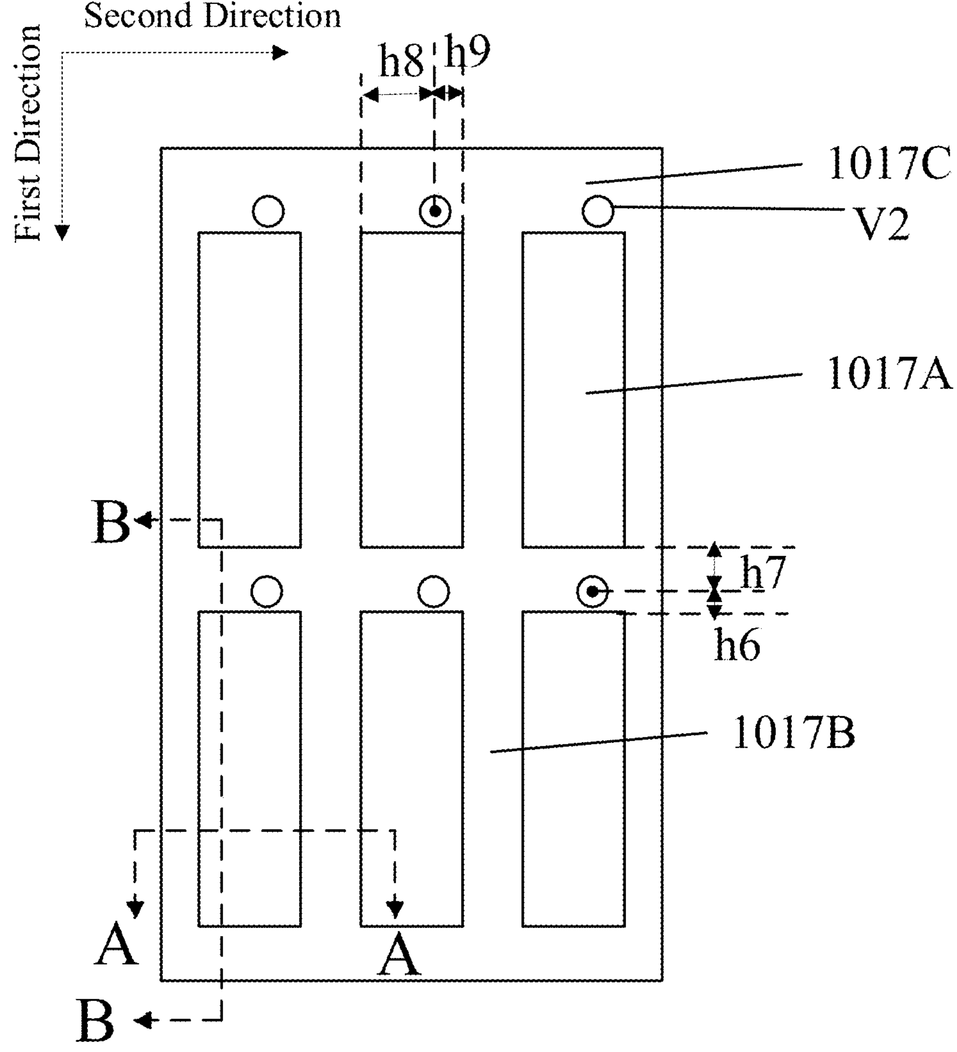
FIG. 7 is a partial planar view of a pixel definition layer of a display panel provided by at least one embodiment of the present disclosure.

For example, FIG. 7 shows a simple schematic diagram of the pixel definition layer 1017, as shown in FIG. 4G and FIG. 7, the pixel definition layer 1017 includes a plurality of first barrier dams 1017B extending in the first direction and a plurality of second barrier dams 1017C extending in the second direction, that is, the first barrier dam 1017B is located between sub-pixel openings 1017A adjacent in the second direction, and the second barrier dam 1017C is located between sub-pixel openings 1017A adjacent in the first direction. The plurality of first barrier dams 1017B and the plurality of second barrier dams 1017C are configured to define the sub-pixel openings 1017A of the plurality of sub-pixels. The above-mentioned first direction is different from the second direction, for example, the first direction is perpendicular to the second direction.

For example, in the example of FIG. 7, the first direction is the vertical direction in the figure, that is, the column direction of the sub-pixels, and the second direction is the horizontal direction in the figure, that is, the row direction of the sub-pixels. In other embodiments, the first direction may be the horizontal direction and the second direction may be the vertical direction.

For example, when the light-emitting material layer 1042 is formed in the sub-pixel opening 1017A by inkjet printing, the first barrier dam 1017B and the second barrier dam 1017C can play a role in blocking the light-emitting material, so that the light-emitting material can be fully printed into the sub-pixel opening 1017A.

Figure 8:
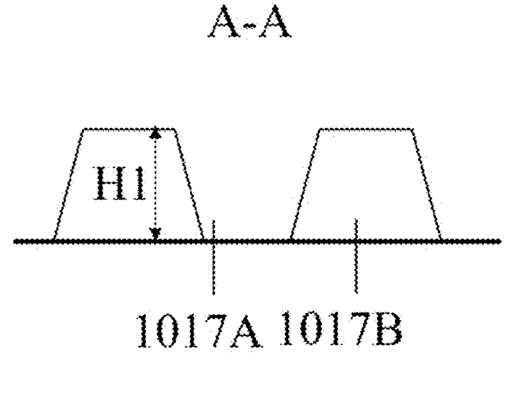
FIG. 8 is a schematic cross-sectional view of the pixel definition layer in FIG. 7 taken along a line A-A.
Figure 9:
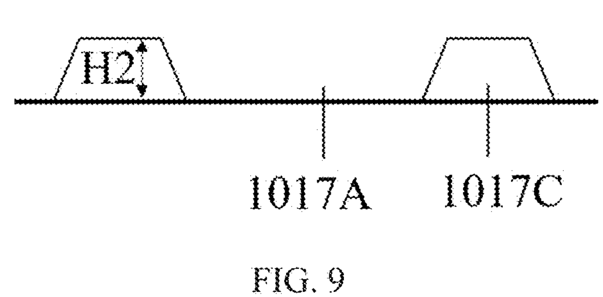
FIG. 9 is a schematic cross-sectional view of the pixel definition layer in FIG. 7 taken along a line B-B.

For example, FIG. 8 shows a schematic cross-sectional view of the pixel definition layer in FIG. 7 taken along the line A-A, which shows a cross-section of the first barrier dam 1017B, and FIG. 9 shows a schematic cross-sectional view of the pixel definition layer in FIG. 7 taken along the line B-B, which shows a cross-section of the second barrier dam 1017C. In some embodiments, as shown in FIG. 8 and FIG. 9, the thickness H1 of the first barrier dam 1017B is greater than the thickness H2 of the second barrier dam 1017C in the direction perpendicular to the base substrate 110.

For example, in some embodiments, the light-emitting colors of the sub-pixels located in the same column are the same, that is, the light-emitting material layers of the sub-pixels located in the same column are the same. Therefore, by making the thickness H1 of the first barrier dam 1017B greater than the thickness H2 of the second barrier dam 1017C, when the light-emitting material layer 1042 is formed in the sub-pixel opening 1017A by a method of, for example, inkjet printing, the first barrier dam 1017B can effectively prevent crosstalk of light-emitting materials of different colors, while the thickness H2 of the second barrier dam 1017C is relatively low, and therefore the light-emitting materials of the light-emitting devices of the sub-pixels in the same column can circulate with each other, so that the light-emitting materials are evenly distributed in the sub-pixel openings 1017A in the same column, thereby contributing to improving the uniformity of the light-emitting material layers 1042 formed in the sub-pixel openings 1017A after the solvent volatilizes, thereby improving the overall display uniformity of the display substrate.

Figure 10:
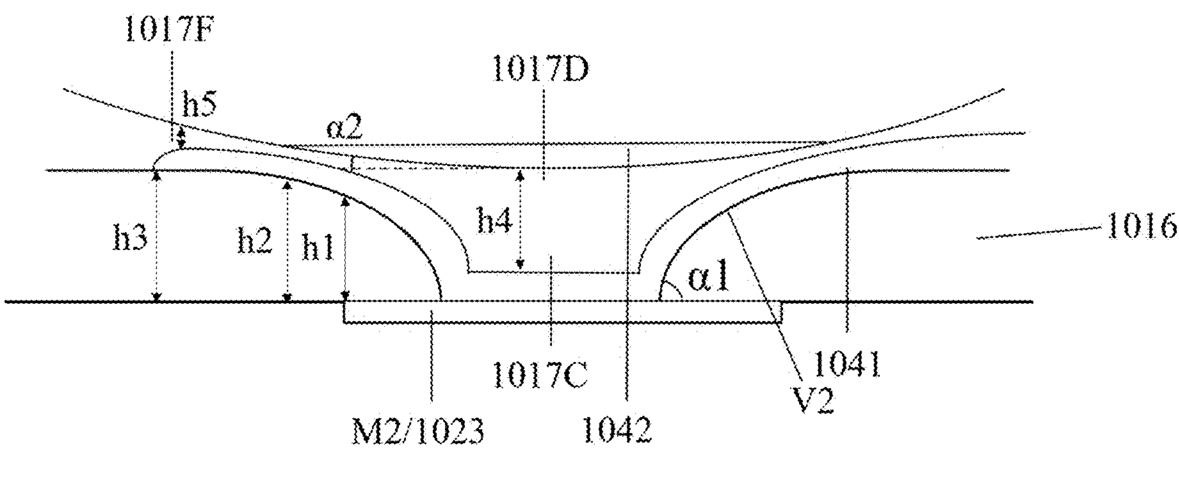
FIG. 10 is a partial cross-sectional view of a planarization layer and a pixel definition layer near a second via in a display panel provided by at least one embodiment of the present disclosure.

For example, FIG. 10 shows a partial schematic cross-sectional view of the planarization layer and the pixel definition layer near the second via. In some embodiments, as shown in FIG. 10, at the position of the second via V2, along the second direction (horizontal direction in the figure), at the boundary of the second metal pattern M2, the thickness of the planarization layer 1016 is h1, at the boundary of the light-emitting material layer 1042, the thickness of the planarization layer 1016 is h2, and at the boundary of the electrode pattern 1041, the thickness of the planarization layer 1016 is h3, and it is satisfied that $$h1/h2 < h2/h3.$$

As a result, the slope of the planarization layer 1016 at the second via V2 gradually becomes gentle in the direction away from the second via V2, thereby realizing a better planarization effect.

For example, in some embodiments, as shown in FIG. 6, the diameter of the first opening O1 is L1, the diameter of the second opening O2 is L2, and it is satisfied that $$L1 > L2 + 2 * f * (h/\tan\alpha 1).$$

In the above formula, f is a constant, and $1.5 \le f \le 3.4$.

For example, the larger the slope angle α1 of the planarization layer 1016 at the second via V2, the smaller the diameter L1 of the first opening. In the case that f is in the above-mentioned value range, the size and structure of the second via V2 are in an appropriate range, which helps to achieve a high aperture ratio and maintain the stability of the structure.

For example, in some embodiments, L1/L2≥2.5. In the case that L1/L2 is too small, there is a risk that the electrode pattern 1041 breaks in the second via V2, and in the above-mentioned size range of L1/L2, the structure of the display panel near the second via V2 is more stable, to improve the reliability of the display panel.

For example, in some embodiments, h=k*h2, k is a constant, and 0.5<k<1. Thus, the relationship between the thickness of the planarization layer 1016 at the boundary of the light-emitting material layer 1042 and the thickness of the planarization layer 1016 is established.

For example, in some embodiments, as shown in FIG. 10, in the direction perpendicular to the base substrate 110, the second barrier dam 1017C includes a first part 1017D that overlaps with the second via V2 and a second part 1017F that does not overlap with the second via 1017C, and the thickness h4 of the first part 1017D is greater than the thickness h5 of the second part 1017F. For example, the slope angle α2 of the first part 1017D at the boundary of the second via V2 is smaller than the slope angle α1 of the planarization layer 1016 at the second via V2. Therefore, the second barrier dam 1017C can at least partially fill the second via V2, or even completely fill the second via V2, so as to prevent the uneven structure at the second via V2 from affecting the display effect of the display panel.

For example, in some embodiments, in the first direction, in at least part of the sub-pixels, the shortest distances between the center point of the second via V2 and the edges of the second barrier dam 1017C covering the second via V2 are different. For example, as shown in FIG. 7, the shortest distance between the center point of the second via V2 and the lower edge of the second barrier dam covering the second via V2 is h6, and the shortest distance between the center point of the second via V2 and the upper edge of the second barrier dam covering the second via V2 is h7, and h6 is different from h7, for example, h6 is smaller than h7.

For example, in some embodiments, in the second direction, in at least part of the sub-pixels, the distances respectively between the center point of the second via V2 and the two adjacent first barrier dams 1017B are different. For example, as shown in FIG. 7, the distance between the center point of the second via V2 and the left adjacent first barrier dam 1017B is h8, and the distance between the center point of the second via V2 and the right adjacent first barrier dam 1017B is h9, and h8 is different from h9, for example, h8 is greater than h9.

Therefore, the second via V2 is relatively shifted to the right in the area occupied by the sub-pixel, so that the magnitude of the storage capacitor in the pixel driving circuit of the sub-pixel can be reduced, and the light-emitting duration of the sub-pixel can be further reduced, so that the lifetime of the sub-pixel can be prolonged, and the effect of uniform lifetime of sub-pixels of different colors can be achieved.

The embodiments of the present disclosure do not limit the materials of various function layers and other structures. For example, the base substrate 110 may be a rigid substrate such as a glass substrate, a quartz substrate, and the like, or a flexible substrate such as a polyimide substrate and the like, the light-shielding layer SHL may be made of a metal material, such as copper (Cu), aluminum (Al), titanium (Ti), molybdenum (Mo), and the like, or an alloy material thereof, and the gate electrode 1022 may be made of a metal material, such as copper (Cu), aluminum (Al), titanium (Ti), molybdenum (Mo), and the like, or an alloy material thereof. The source and drain electrodes 1023 and 1024 may be made of a metal material, such as copper (Cu), aluminum (Al), titanium (Ti), molybdenum (Mo), and the like, or an alloy material thereof, for example, the source and drain electrodes 1023 and 1024 may by formed into single metal layer structures or multi-layer metal layer structures such as titanium/aluminum/titanium, etc. The semiconductor material layer may be made of a silicon-based material (such as amorphous silicon a-Si, polysilicon p-Si, etc.), a metal oxide semiconductor (such as IGZO, ZnO, AZO, IZTO, etc.) or an organic material (such as hexathiophene, polythiophene, etc.).

For example, as shown in FIG. 2 and FIG. 3, the display panel may further include a barrier layer 1112 and a buffer layer 1013 that are arranged on the base substrate 110, and the barrier layer 1112 and the buffer layer 1013 can prevent impurities in the base substrate 110 from entering the plurality of function layers in the display panel 110, thereby playing a protective role. For example, the barrier layer 1112 and the buffer layer 1013 may be made of an inorganic insulating material such as silicon oxide, silicon nitride or silicon oxynitride. For example, the gate insulation layer 1014 and the interlayer insulation layer 1015 may be made of an inorganic insulating material such as silicon oxide, silicon nitride or silicon oxynitride.

For example, as shown in FIG. 2 and FIG. 3, the display panel may further include a spacer 108 for defining an encapsulation space and an encapsulation layer EN for encapsulating the light-emitting devices EM. The encapsulation layer EN is, for example, a composite encapsulation layer, including a first inorganic encapsulation layer 1051, an organic encapsulation layer 1052 and a second inorganic encapsulation layer 1053. For example, the first inorganic encapsulation layer 1051 and the second inorganic encapsulation layer 1053 may be made of an inorganic insulating material such as silicon oxide, silicon nitride or silicon oxynitride, etc. The spacer 108 and the organic encapsulation layer 1052 may be made of an organic insulating material such as polyimide, resin, etc.

For example, the planarization layer 1016 and the pixel definition layer 1017 may be made of an organic insulating material such as polyimide, resin, etc.

For example, the display panel may further include other structures besides the above-mentioned structures. For details, please refer to related technologies, which is not be repeated here.

In addition, it should be noted that in the embodiments of the present disclosure, each thin film transistor may be a P-type thin film transistor or an N-type thin film transistor, and the structure of the thin film transistor may be a bottom gate type, a top gate type or a double gate type. The structure shown in the drawings is only exemplary, and the embodiments of the present disclosure do not limit the specific form of each thin film transistor.

At least one embodiment of the present disclosure provides a display device, the display device includes any one of the above-mentioned display panels, and the display device may be realized as a large-size and narrow-frame display device. For example, the display device may be a mobile phone, a tablet computer, a television, a display, a notebook computer, a digital photo frame, a navigator or other products or components with display functions.

The following statements should be noted:

(1) The drawings involve only the structure(s) in connection with the embodiment(s) of the present disclosure, and other structure(s) can be referred to common design(s).

(2) For clarity, in the drawings used to describe the embodiments of the present disclosure, the thicknesses of layers or regions are enlarged or reduced, that is, the drawings are not drawn to actual scale. It can be understood that when a component such as a layer, film, region or substrate is referred to as being "on" or "under" another component, the component may be "directly" "on" or "under" another component, or one or more intermediate components may be interposed therebetween.

(3) In case of no conflict, features in one embodiment or in different embodiments can be combined to obtain new embodiments.

What have been described above are only specific implementations of the present disclosure, the protection scope of the present disclosure is not limited thereto, and the protection scope of the present disclosure should be based on the protection scope of the claims.

The invention claimed is:

1. A display panel, comprising a base substrate and a plurality of sub-pixels on the base substrate, wherein each of at least part of the sub-pixels comprises a pixel driving circuit and a light-emitting device, the pixel driving circuit comprises a first metal pattern, an active pattern and a second metal pattern that are on the base substrate, and the light-emitting device comprises an electrode pattern electrically connected to the second metal pattern, the at least part of the sub-pixels comprises a first color sub-pixel and a second color sub-pixel, the first color sub-pixel and the second color sub-pixel are configured to emit light of different colors, in the first color sub-pixel, a ratio of an overlapping area of the active pattern and the first metal pattern to an area of the electrode pattern is X1, in the second color sub-pixel, a ratio of an overlapping area of the active pattern and the first metal pattern to an area of the electrode pattern is X2, and $$1/2 \leq X_1/X_2 < 1.$$

2. The display panel according to claim 1, wherein the active pattern is on a side of the first metal pattern close to the base substrate or on a side of the first metal pattern away from the base substrate, the second metal pattern is on a side of the active pattern away from the base substrate, and the electrode pattern is on a side of the second metal pattern from the base substrate.

3. The display panel according to claim 1, wherein a light emission brightness of the first color sub-pixel is L1, a light emission brightness of the second color sub-pixel is L2, and $$-10\% < \frac{\alpha\left(\frac{L1}{L2}\right) - \beta\left(\frac{X1}{X2}\right)}{\frac{1}{(\alpha+\beta)}\left(\left(\frac{L1}{L2}\right) + \left(\frac{X1}{X2}\right)\right)} < 10\%,$$

wherein α represents an expected brightness parameter, and a value range of α is −2.00<α<9.50, β represents a capacitance compensation parameter, and a value range of β is 0.95<β<1.05.

4. The display panel according to claim 3, wherein $$-7\% < \frac{\alpha\left(\frac{L1}{L2}\right) - \gamma\left(\frac{y2}{y1}\right)}{\frac{1}{(\alpha+\gamma)}\left(\left(\frac{L1}{L2}\right) + \left(\frac{y2}{y1}\right)\right)} < 7\%,$$

γ represents a compensation parameter of light intensity control, and a value range of γ is γ<−0.4 or γ>0.3.

5. The display panel according to claim 4, wherein $$-5\% < \frac{\alpha\left(\frac{L1}{L2}\right) - \beta\left(\frac{X1}{X2}\right) - \gamma\left(\frac{y2}{y1}\right)}{\frac{1}{(\alpha+\beta+\gamma)}\left(\left(\frac{L1}{L2}\right) + \left(\frac{X1}{X2}\right) + \left(\frac{y2}{y1}\right)\right)} < 5\%.$$

6. The display panel according to claim 1, wherein the active pattern is electrically connected to the second metal pattern through a first via, and the second metal pattern is electrically connected to the electrode pattern through a second via;

in the first color sub-pixel, a distance between a center point of the first via and a center point of the second via is y1, in the second color sub-pixel, a distance between a center point of the first via and a center point of the second via is y2, and $$a * X_1 + b * \frac{1}{y1} < a * X_2 + b * \frac{1}{y2},$$

wherein a and b are constants.

7. The display panel according to claim 6, further comprising:

a planarization layer, on a side of the second metal pattern away from the base substrate, wherein the second via penetrates the planarization layer, the second via has a first opening on a surface of the planarization layer away from the base substrate, and has a second opening on a surface of the planarization layer close to the base substrate, and an orthographic projection of the second opening on the base substrate is within an orthographic projection of the first opening on the base substrate, in the first color sub-pixel, an overlapping area of the orthographic projection of the first opening on the base substrate and an orthographic projection of the second metal pattern on the base substrate is Y1, in the second color sub-pixel, an overlapping area of the orthographic projection of the first opening on the base substrate and an orthographic projection of the second metal pattern on the base substrate is Y2, and $$Y1 > Y2.$$

8. The display panel according to claim 7, wherein a value range of a slope angle α1 of the planarization layer at a position of the second via is:

$$75 \text{ degrees} \geq \alpha 1 \geq 40 \text{ degrees}.$$

9. The display panel according to claim 7, wherein in a direction perpendicular to the base substrate, a value range of a thickness h of the planarization layer is:

$$h \leq 5.5 \text{ microns}.$$

10. The display panel according to any one of claim 7, further comprising:

a pixel definition layer, on a side of the electrode pattern away from the base substrate, wherein the pixel definition layer comprises a plurality of first barrier dams extending in a first direction and a plurality of second barrier dams extending in a second direction, and the first barrier dams and the second barrier dams are configured to define sub-pixel openings of the plurality of sub-pixels, and the first direction is different from the second direction;

the light-emitting device further comprises a light-emitting material layer in each of the plurality of sub-pixel openings, in a direction perpendicular to the base substrate, a thickness of the first barrier dam is greater than a thickness of the second barrier dam, at a position of the second via, along the second direction, a thickness of the planarization layer is h1 at a boundary of the second metal pattern, a thickness of the planarization layer is h2 at a boundary of the light-emitting material layer, and a thickness of the planarization layer at a boundary of the electrode pattern is h3, and $$h1/h2 < h2/h3.$$

11. The display panel according to claim 10, wherein a diameter of the first opening is L1, a diameter of the second opening is L2, and $$L1 > L2 + 2 * f * (h/\tan\alpha 1),$$

f is a constant, and 1.5≤f≤3.4.

12. The display panel according to claim 10, wherein in the direction perpendicular to the base substrate, the second barrier dam comprises a first part overlapping with the second via and a second part not overlapping with the second via, and a thickness of the first part is greater than a thickness of the second part.

13. The display panel according to claim 12, wherein a slope angle of the first part at a boundary of the second via is smaller than a slope angle α1 of the planarization layer at a position of the second via.

14. The display panel according to claim 10, wherein in the first direction, in at least part of the sub-pixels, shortest distances between the center point of the second via and edges of the second barrier dam covering the second via are different.

15. The display panel according to claim 10, wherein in the second direction, in at least part of the sub-pixels, distances between the center point of the second via and two adjacent first barrier dams are different.

16. The display panel according to claim 1, wherein the first color sub-pixel is a blue sub-pixel, and the second color sub-pixel is a green sub-pixel or a red sub-pixel.

17. The display panel according to claim 1, wherein the at least part of the sub-pixels further comprises a third color sub-pixel, and the display panel further comprises a plurality of reset signal lines configured to transmit reset signals to the at least part of the sub-pixels, wherein an extension length of a reset signal line transmitting a reset signal for the first color sub-pixel in a second direction is D1, an extension length of a reset signal line transmitting a reset signal for the second color sub-pixel in the second direction is D2, and an extension length of a reset signal line transmitting a reset signal for the third color sub-pixel in the second direction is D3, and $$D3 > D2, \quad D3 > D1.$$

18. The display panel according to claim 17, wherein the first color sub-pixel is a blue sub-pixel, the second color sub-pixel is a green sub-pixel, and the third color sub-pixel is a red sub-pixel.

19. The display panel according to claim 17, wherein at least part of the plurality of reset signal lines respectively comprise a part extending in a first direction and a part extending in the second direction, the first direction is different from the second direction.

20. The display panel according to claim 19, wherein signal lines extending along the first direction are respectively provided at two sides, in the second direction, of the electrode pattern, in at least part of the sub-pixels, signals transmitted by the signal lines extending along the first direction at the two sides of the electrode pattern are different.

* * * * *